United States Patent
Redeker et al.

(10) Patent No.: US 6,864,181 B2
(45) Date of Patent: Mar. 8, 2005

(54) METHOD AND APPARATUS TO FORM A PLANARIZED CU INTERCONNECT LAYER USING ELECTROLESS MEMBRANE DEPOSITION

(75) Inventors: Fred C. Redeker, Fremont, CA (US); John Boyd, Atascadero, CA (US)

(73) Assignee: Lam Research Corporation, Fremont, CA (US)

(*) Notice: Subject to any disclaimer, the term of this patent is extended or adjusted under 35 U.S.C. 154(b) by 1 day.

(21) Appl. No.: 10/402,600

(22) Filed: Mar. 27, 2003

(65) Prior Publication Data

US 2004/0192030 A1 Sep. 30, 2004

(51) Int. Cl.[7] .................. H01L 21/311; H01L 23/48; C03C 15/00

(52) U.S. Cl. .............. 438/700; 438/689; 438/678; 438/687; 438/692; 438/592; 257/758; 257/762; 257/751; 257/643; 257/635; 216/87; 216/84; 216/89; 216/37; 216/13

(58) Field of Search .................. 438/700, 689, 438/678, 687, 692, 592, 597, 624, 634; 216/13, 37, 87, 84, 89; 257/758, 762, 635, 643, 751

(56) References Cited

U.S. PATENT DOCUMENTS

| | | |
|---|---|---|
| 6,454,916 B1 | 9/2002 | Wang et al. |
| 2002/0134748 A1 * | 9/2002 | Basol et al. .................. 216/13 |
| 2003/0064669 A1 * | 4/2003 | Basol et al. ................. 451/259 |
| 2003/0119311 A1 * | 6/2003 | Basol et al. ................. 438/678 |

OTHER PUBLICATIONS

Nobe et al., "Hitachi Chemical Metal CMP Slurry and Low–K Material," CMPUG, Aug. 7, 2002.
"CMP Slurry", Hitachi Chemical, Hitachi Chemical, Japan.
Park et al., "Chip–Scale Modeling of Copper Plating Pattern Dependencies," NFS/SRC ERC TeleSeminar, Feb. 20, 2003, pp. 1–34, Massachusetts Institute of Technology.
"CIRCUPOSIT Electroless Copper 3350," Shipley Ronal PWB Metallization, 2000, pp. 1–6, Shipley Company LLC, USA.
Material Safety Data Sheet CIRCUPOSIT 3350 R Copper Replenisher, Apr. 4, 1997, pp. 1–6, Shipley Company.
Material Safety Data Sheet CIRCUPOSIT 3350 M Electroless Copper, Apr. 4, 1997, pp. 1–6, Shipley Company.
Material Safety Data Sheet CIRCUPOSIT 3350 C Electroless Copper, Apr. 4, 1997, pp. 1–7, Shipley Company.
Material Safety Data Sheet CIRCUPOSIT 3350 B Electroless Copper, Apr. 4, 1997, pp. 1–7, Shipley Company.
Material Safety Data Sheet CIRCUPOSIT 3350 A Electroless Copper, Apr. 4, 1997, pp. 1–8, Shipley Company.

* cited by examiner

Primary Examiner—Matthew Smith
Assistant Examiner—Igwe U. Anya
(74) Attorney, Agent, or Firm—Carr & Ferrell LLP

(57) ABSTRACT

A planarized conductive material is formed over a substrate including narrow and wide features. The conductive material is formed through a succession of deposition processes. A first deposition process forms a first layer of the conductive material that fills the narrow features and at least partially fills the wide features. A second deposition process forms a second layer of the conductive material within cavities in the first layer. A flexible material can reduce a thickness of the first layer above the substrate while delivering a solution to the cavities to form the second layer therein. The flexible material can be a porous membrane attached to a pressurizable reservoir filled with the solution. The flexible material can also be a poromeric material wetted with the solution.

63 Claims, 14 Drawing Sheets

METHOD AND APPARATUS TO FORM A PLANARIZED CU INTERCONNECT LAYER USING ELECTROLESS MEMBRANE DEPOSITION

BACKGROUND OF THE INVENTION

1. Field of the Invention

The present invention relates generally to the field of semiconductor fabrication and more particularly to methods and apparatuses for forming conductive materials with planarized surfaces within features defined in a substrate, the features having widely different dimensions.

2. Description of the Prior Art

FIG. 1 provides a cross-section of a partially fabricated semiconductor device 100 including a substrate 102 and a conductive layer 104. The substrate 102 is typically a dielectric material and can include trenches of various dimensions such as wide trench 106 and narrow trenches 108. In addition to trenches, the substrate 102 can include other similar features of various dimensions such as vias (not shown). Such features in the substrate 102 are commonly fabricated through well known photolithography processes. The conductive layer 104 is typically a highly conductive metal such as copper (Cu). After further processing, the conductive layer 104 is removed down to the level of the top surface of the substrate 102 such that the conductive material remaining in the trenches 106, 108 and other similar features are electrically separated by the substrate 102 in the finished semiconductor device.

The conductive layer 104 is commonly formed through electroplating with an electroplating solution that contains the metal to be plated. Electroplating is desirable because it is a rapid method for depositing a metal on a surface. One of the drawbacks of electroplating, however, is that voids frequently form in the more narrow features, such as trenches 108, and such voids can cause failures in the finished semiconductor device. Certain additives when added to the electroplating solution can promote rapid filling of the narrow features and prevent void formation, however, these same additives tend to retard the deposition rate in generally flat areas such as the surfaces between trenches 106, 108 and along the bottom of the wide trench 106.

Accordingly, by the time the conductive layer 104 completely fills the larger features, such as wide trench 106, a substantial thickness, or overburden 110, covers the remainder of the substrate 102. Further, since the additives to the electroplating solution promote rapid filling of the narrow features while retarding it in generally flat areas, an area of superfill 112 can also develop above the level of the top of the overburden 110 over narrow features, as shown in FIG. 1. It will be appreciated that to remove the conductive layer 104 down to the level of the top surface of the substrate 102 requires removing three different thicknesses of material. Unfortunately, the planarization techniques known in the art are poorly suited to such a task, and generally cause dishing 200 over larger features, such as shown over large trench 106 in FIG. 2.

One solution is to electroplate further than is shown in FIG. 1 such that the thickness of the overburden 110 is greater over the entire substrate 102. If carried far enough, the thickness of the overburden 110 tends to even out over the entire substrate 102. The overburden 110 can then be uniformly planarized down to the level of the top surface of the substrate 102. This solution, however, wastes material and is time consuming.

Therefore, what is desired is a method of forming a conductive layer 104 with an overburden 110 that has an essentially planar surface.

SUMMARY

The invention provides a method for producing a planarized surface including providing a substrate, forming first and second layers, and planarizing the first and second layers. The substrate has a narrow feature and a wide feature defined therein, and the first layer is formed above the substrate such that it fills the narrow feature, at least partially fills the wide feature, and has a cavity defined therein that is aligned with the wide feature. The second layer is formed in the cavity while the first layer is contemporaneously planarized. The first and second layers are then planarized together.

In some embodiments forming the second layer while planarizing the first layer includes contacting a flexible material with the first layer, and introducing a relative lateral motion between the flexible material and the first layer. In some of these embodiments the relative lateral motion includes a rotational component, a vibrational component, and/or an orbital component. In those embodiments in which the first layer completely fills the wide feature, planarizing the first and second layers can include completely removing the second layer. In other embodiments planarizing the first and second layers does not completely remove the second layer. In some embodiments planarizing the first and second layers includes a stress-free planarization or a chemical-mechanical planarization. In some embodiments planarizing the first and second layers includes exposing the substrate between the narrow and wide features.

The invention also provides a method for producing a planarized surface that includes providing a substrate, forming a first layer, contacting a flexible material with at least a portion of the first layer, forming a second layer, and planarizing the first and second layers. The substrate has a narrow feature and a wide feature defined therein, and the first layer is formed above the substrate such that it fills the narrow feature, at least partially fills the wide feature, and has a cavity defined therein that is aligned with the wide feature. According to the method, the flexible material is used to deliver a solution to the cavity and the second layer is formed from the solution. In some embodiments the solution includes an electroless plating solution, and in some of these embodiments forming the second conductive layer includes an electroless deposition of a conductive material, such as copper. In some embodiments the first and second layers are formed of the same conductive material. In some embodiments contacting the flexible material with at least the portion of the first layer inhibits the deposition of the second layer above an overburden of the first layer.

In some embodiments of this method, the substrate can include a dielectric material with a dielectric constant less than a dielectric constant of $SiO_2$, such as organosilicate glass. In some embodiments, the narrow feature can have a lateral dimension of about 100 nm or less, and in some embodiments the wide feature can have a lateral dimension greater than about 100 nm or of about 500 $\mu$m. In some embodiments, forming the first layer includes forming a first conductive layer, and in some of these embodiments forming the first conductive layer includes an electrochemical deposition of a conductive material, such as copper. In some embodiments planarizing the first and second layers includes applying a stress-free polishing technique.

In some embodiments of this method the flexible material includes a porous membrane such as polyurethane. In some of these embodiments the method further includes pressurizing a reservoir containing the solution and adjoining the membrane on a side opposite a side contacting the first layer. Also in some of these embodiments the method further includes introducing a relative lateral motion between the porous membrane and the substrate. In some of the embodiments that include introducing a relative lateral motion, the porous membrane is effective to polish the portion of the first layer, for example, because the porous membrane includes an abrasive.

In some embodiments of this method the flexible material includes a poromeric material. In some of these embodiments the poromeric material includes a closed-cell structure with open pores exposed at a surface thereof. In some of these embodiments the method further includes wetting the poromeric material with the solution. Also in some of these embodiments delivering the solution to the cavity can include developing a pressure between the poromeric material and the first layer. In some of these embodiments delivering the solution to the cavity can also include introducing a relative lateral motion between the substrate and the poromeric material.

In some embodiments of this method forming the first layer includes completely filling the wide feature, and in some of these embodiments the first layer forms an overfill above the wide feature that extends about 10% to about 20% of a depth of the wide feature above a level of a top surface of the substrate. Also in some of these embodiments planarizing the first and second layers includes removing the second layer. In other embodiments of this method forming the first layer includes filling less than the entire wide feature, and in some of these embodiments about 10% to about 30% of a depth of the wide feature is filled by the first layer. Also in some of these embodiments planarizing the first and second layers includes removing less than the entire second layer.

The invention also provides an apparatus for producing a planarized surface. The apparatus includes a wafer support, such as a vacuum chuck, for securing a wafer having an area, a workpiece, an engagement mechanism capable of bringing the workpiece and the wafer into contact with each other, and means for introducing a relative lateral motion between the workpiece and the wafer. The workpiece includes a reservoir containing an electroless plating solution and having a flexible and porous membrane spanning a side. In some embodiments the reservoir is pressurizable. In some embodiments the porous membrane includes an abrasive.

In some embodiments of this apparatus the porous membrane has an area less than the area of the wafer. In some of these embodiments the means for introducing relative lateral motion includes means for linearly translating the workpiece, and in some of these embodiments the means for introducing relative lateral motion further includes means for rotating the workpiece around an axis. In some embodiments the means for introducing relative lateral motion can also include means for rotating the wafer support around an axis and/or vibrating the workpiece.

In some embodiments of this apparatus the porous membrane has an area equal to or larger than the area of the wafer. In some of these embodiments the means for introducing relative lateral motion includes means for rotating the workpiece and/or the wafer support around an axis.

In some embodiments of this apparatus the porous membrane can be polyurethane, a fluorocarbon material, a sintered polymeric material, or a ceramic. In some embodiments the porous membrane can have a thickness between about 0.1 mm to about 3.0 mm. In some embodiments the porous membrane can include an open-cell pore structure. In some embodiments the porous membrane can include a number of holes disposed therethrough. Also in some embodiments the porous membrane can include an amount of porosity between about 5% to about 50%, and in some of these embodiments the amount of porosity is between about 10% to about 20%.

Another apparatus of the invention includes a wafer support for securing a wafer, a flexible poromeric material wetted with an electroless plating solution, an engagement mechanism capable of bringing the poromeric material into contact with the wafer, and means for introducing a relative lateral motion between the poromeric material and the wafer. In some embodiments the poromeric material includes a polymeric material, and in some embodiments the prometric material includes a closed-cell structure with open pores exposed at a surface. In some embodiments the poromeric material is in a shape of a continuous loop, a disk, or a rectangle. Also in some embodiments the poromeric material includes a raised edge to contain the electroless plating solution.

DETAILED DESCRIPTION OF THE INVENTION

Figure 3:
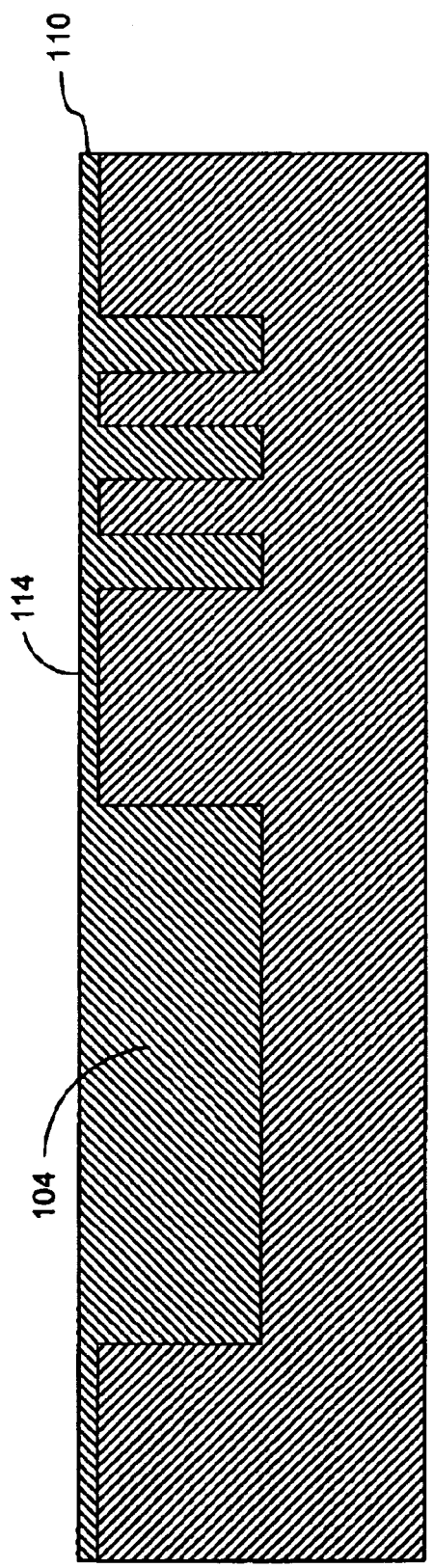
FIG. 3 is a cross-section of a partially fabricated semiconductor device according to an embodiment of the invention.

The invention employs two deposition processes in succession to form a conductive layer over a substrate that includes both narrow and wide features such that the conductive layer has an overburden with an essentially planar surface, as shown in FIG. 3. Initially, a first process such as electroplating is used to form a first layer of the conductive layer. The first process is discontinued after the narrow features are completely filled. Next, a second process, such as electroless deposition, is used to form a second layer within cavities in the first layer associated with the wide features. The second layer is formed such that it has a top surface that is essentially coplanar with a top surface of an overburden of the first layer.

In some embodiments a flexible material is brought into contact with the first layer during the second process to inhibit deposition on top surfaces of the overburden so that the thickness of the overburden does not appreciably increase while deposition is occurring within cavities in the first layer such as a cavity 114 (FIG. 1) in first layer 104 that is aligned with wide trench 106. A relative lateral motion can also be introduced between the flexible material and the first layer to further inhibit deposition on top surfaces of the overburden. The relative lateral motion between the flexible material and the first layer can also cause, in some instances, a reduction in the thickness of the overburden, for example, through polishing. The flexible material can be made abrasive in order to enhance the rate of overburden removal.

The flexible material also can serve to deliver an electroless plating solution to the cavities. In some embodiments the flexible material is a porous membrane through which the electroless plating solution is passed, in some instances from a pressurized reservoir on the opposite side of the porous membrane. In other embodiments the flexible material is a poromeric material that is wetted with the electroless plating solution. Relative lateral motion then can bring the electroless plating solution to the cavities.

Figure 4:
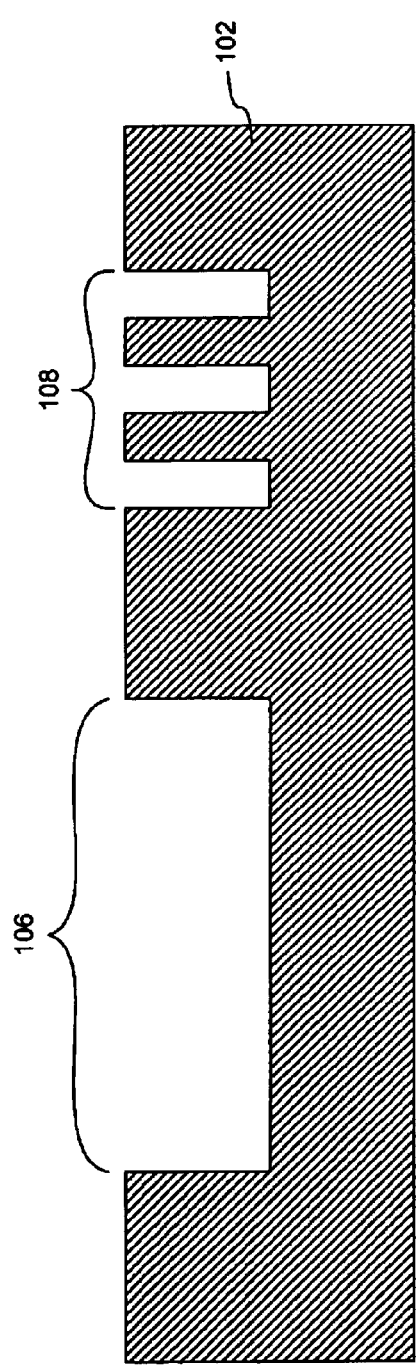
FIG. 4 is a cross-section of a substrate for fabricating a semiconductor device according to an embodiment of the invention.

FIG. 4 provides a cross-section of a substrate 102 for fabricating a semiconductor device. The substrate 102 is typically formed over a wafer (not shown), such as a silicon wafer, and can additionally be formed over previously fabricated device layers (not shown). The substrate 102 can be a dielectric material such as $SiO_2$. The substrate 102 can also be a low dielectric constant ("low k") material, one that has a dielectric constant less than that of $SiO_2$, such as fluorosilicate glass (FSG), organosilicate glass (OSG), or highly porous $SiO_2$. Such low k materials are increasingly favored in semiconductor device fabrication as they impart superior electrical properties to the finished devices. One characteristic common to low k materials, however, is low density and poor mechanical properties such as reduced hardness and increased brittleness. Although the invention is not limited to using low k materials for the substrate 102, it will be appreciated that the present invention has advantages when the substrate 102 is formed of a low k material, as discussed further herein.

The substrate 102 includes features of various dimensions such as wide trench 106 and narrow trenches 108. While trenches 106 and 108 are used herein for illustrative purposes, it will be understood that the invention is equally well suited for substrates that include other common features formed into semiconductor substrates, such as vias. Narrow features such as narrow trenches 108 in some embodiments have lateral dimensions of about 100 nm or less, while wide features such as wide trench 106 in some embodiments have lateral dimensions greater than about 100 nm and up to about 500 µm. Features such as trenches 106, 108 can be fabricated through well known photolithography processes.

Figure 5:
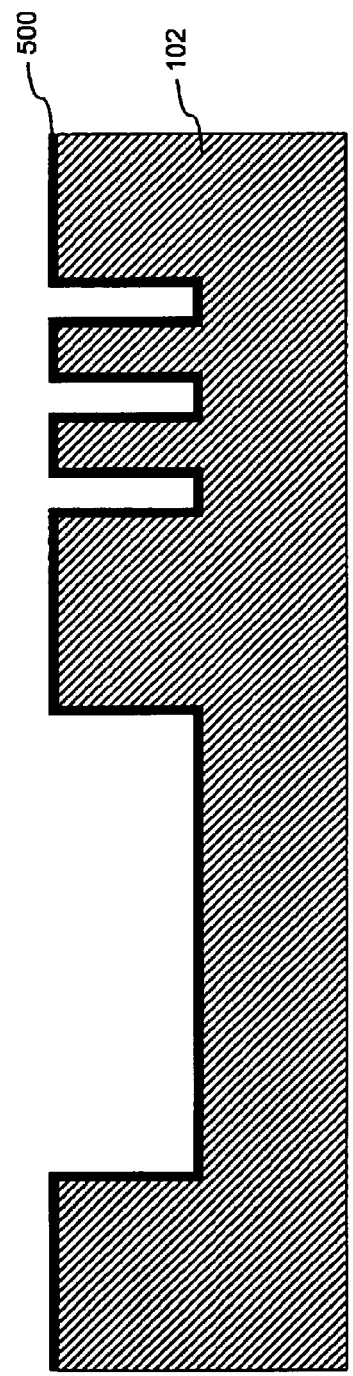
FIG. 5 is a cross-section of the partially fabricated semiconductor device of FIG. 4 after one or more optional layers have been formed over the substrate according to an embodiment of the invention.

FIG. 5 provides a cross-section of the partially fabricated semiconductor device of FIG. 4 after one or more optional layers 500 have been formed over the substrate 102. One optional layer is a barrier layer to prevent metal atoms from a later-deposited layer from eventually diffusing into the substrate 102. The barrier layer can be formed of a material such as Ta or TaN, for example, by chemical vapor deposition (CVD). Another optional layer 500 is a seed layer such as a Cu seed layer formed, for example, by physical vapor deposition (PVD). The seed layer can be deposited over the barrier layer, when present, to promote adhesion, provide a conductive surface, and facilitate uniform layer growth of the subsequent later-deposited layer.

Figure 6A:
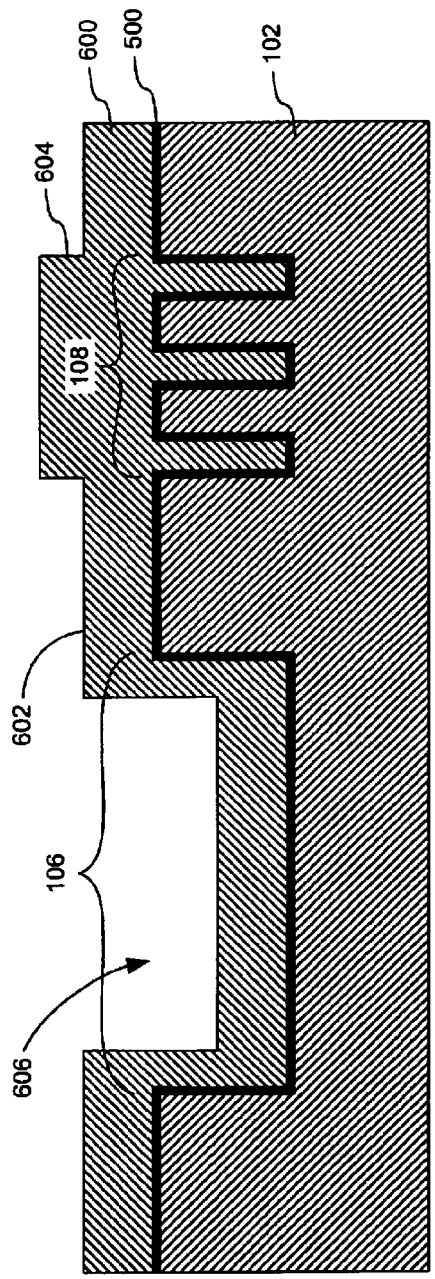
FIG. 6A is a cross-section of the partially fabricated semiconductor device of FIG. 5 after a first conductive layer has been formed over the substrate according to an embodiment of the invention.

FIG. 6A provides a cross-section of the partially fabricated semiconductor device of FIG. 5 after a first conductive layer 600 has been formed over the substrate 102 and over any optional layers 500. First conductive layer 600 is preferably formed of a highly conductive metal such as Cu. First conductive layer 600 can be formed by an electrochemical deposition technique such as electroplating. In an electroplating process a surface to be plated is brought into contact with an electroplating solution containing ions of the metal to be deposited. The surface to be plated is then made to be a cathode in an electrochemical cell. As is well known, the applied voltage across the electrochemical cell causes the metal ions in the electroplating solution to deposit as a metal film on the cathode. In order to prevent voids from forming in the more narrow features, the electroplating solution can also contain additives that inhibit void formation. In some embodiments the electroplating solution contains three additives, an accelerator, a leveler, and an inhibitor. Such electroplating solutions are commonly referred to as 3-component solutions. Suitable 3-component electroplating solutions can be obtained from Shipley Ronal (Freeport, N.Y.).

Figure 1:
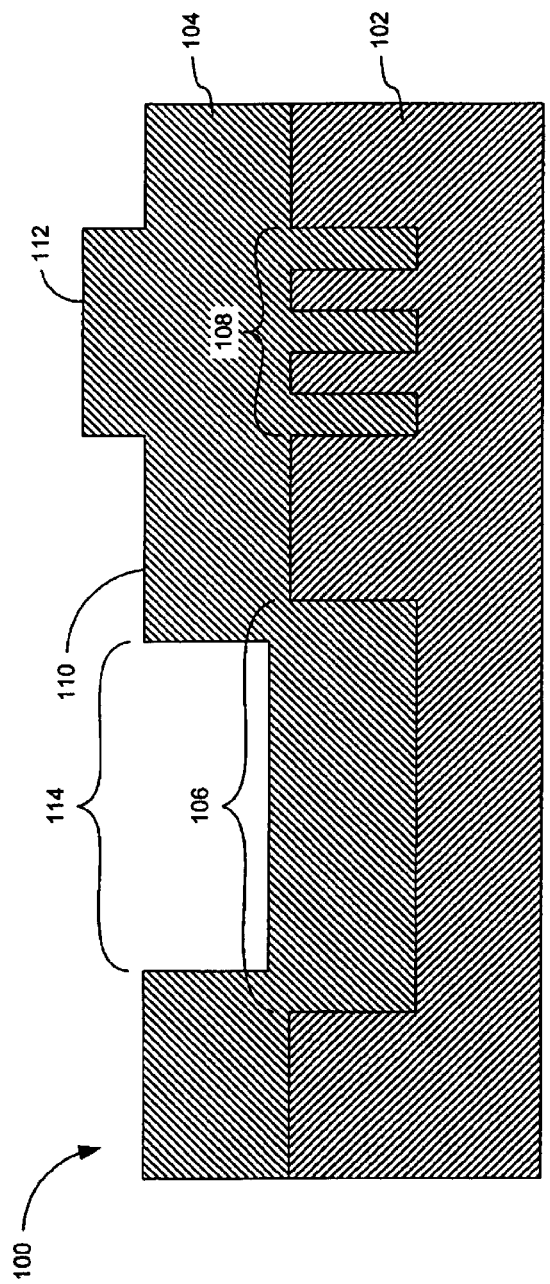
FIG. 1 is a cross-section of a partially fabricated semiconductor device according to the prior art.
Figure 6B:
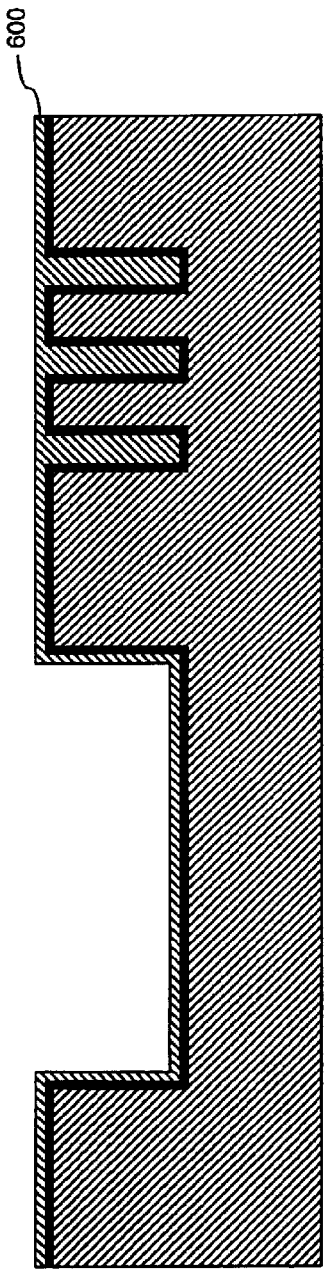
FIG. 6B is a cross-section of the partially fabricated semiconductor device of FIG. 5 after a first conductive layer has been formed over the substrate according to another embodiment of the invention.

In some embodiments, the first conductive layer 600 is formed such that the narrow features such as narrow trenches 108 are completely filled by the first conductive layer 600 while the wider features such as wide trench 106 are at least partially filled. For example, as shown in FIG. 6A, the wide trench 106 is about half filled by first conductive layer 600. In some embodiments about 10% to about 30% of the depth of the wide trench 106 is filled by the first conductive layer 600. When electroplating is used to deposit the first conductive layer 600, the deposition can be stopped after the narrow features are completely filled but before the wider features are completely filled. In these embodiments, an overburden 602 is thinner than the overburden 110 (FIG. 1) and a superfill 604 over narrow trenches 108 is thinner than the superfill 112 (FIG. 1). In some instances, by halting the deposition of the first conductive layer 600 just after the narrow trenches 108 are filled, the superfill effect can be essentially eliminated, as illustrated in FIG. 6B. It can be seen from FIGS. 6A and 6B that first conductive layer 600 includes a cavity 606 that is aligned with the wide trench 106.

Figure 7:
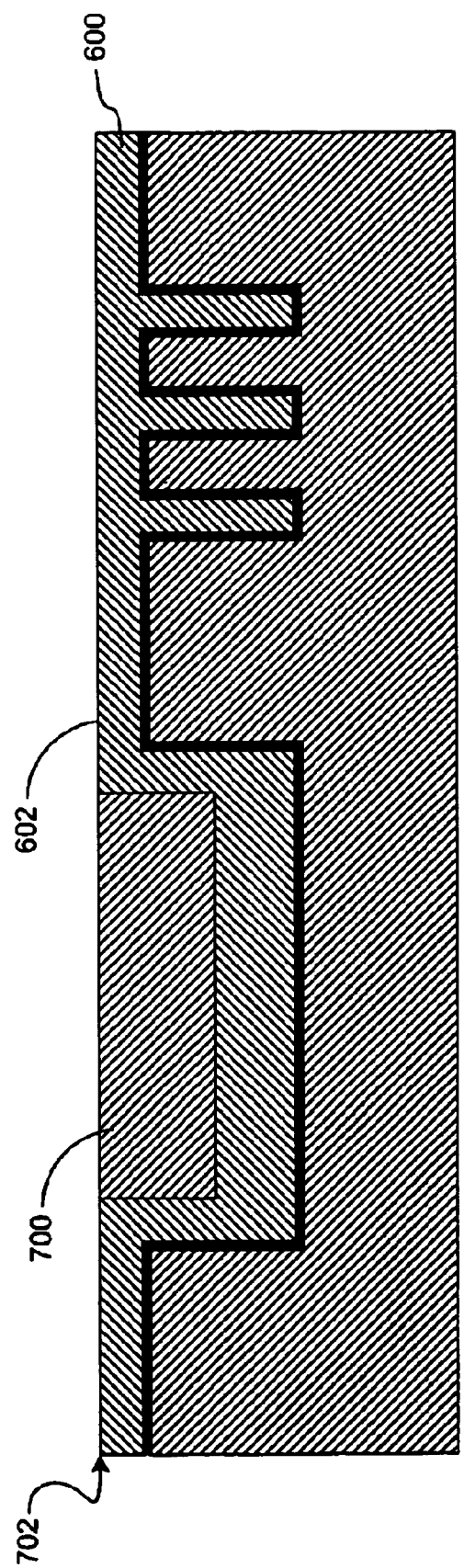
FIG. 7 is a cross-section of the partially fabricated semiconductor device of FIG. 6A after a second conductive layer 700 has been formed according to an embodiment of the invention.

FIG. 7 provides a cross-section of the partially fabricated semiconductor device of FIG. 6A after a second conductive layer 700 has been formed within the cavity 606. Second conductive layer 700 is also preferably formed of a highly conductive metal such as Cu. In some embodiments the first and second conductive layers 600, 700 are formed of the same conductive material. Second conductive layer 700 can be formed by an electroless deposition technique such as electroless plating. In an electroless plating process a metal is deposited from an electroless plating solution, but in contrast to electroplating techniques, no external voltage is applied. Instead, as electroless plating solution including a metal ion species is circulated through the cavity 606, the metal is deposited from the metal ion species by reduction from a reducing agent within the cavity 606 to form the second conductive layer 700. Suitable electroless plating solutions include Circuposit™ Electroless Copper 3350 produced by Shipley Ronal (Freeport, N.Y.).

In some embodiments, while the second conductive layer 700 is being formed within the cavity 606, the superfill 604 and some of the overburden 602 are also being removed. This can cause the removal of substantially all of the superfill 604 and create a generally planar surface of the overburden 602. Therefore, as shown in FIG. 7, once the second conductive layer 700 is complete in these embodiments, the second conductive layer 700 has a top surface that is essentially coplanar with a top surface of the overburden 602 of the first conductive layer 600. Together, the top surfaces of the overburden 602 and the second conductive layer 700 form a pre-planarized surface 702. Methods for limiting the deposition of the second conductive layer 700 to the cavity 606 and for removing the superfill 604 and overburden 602 are discussed elsewhere herein.

Figure 8:
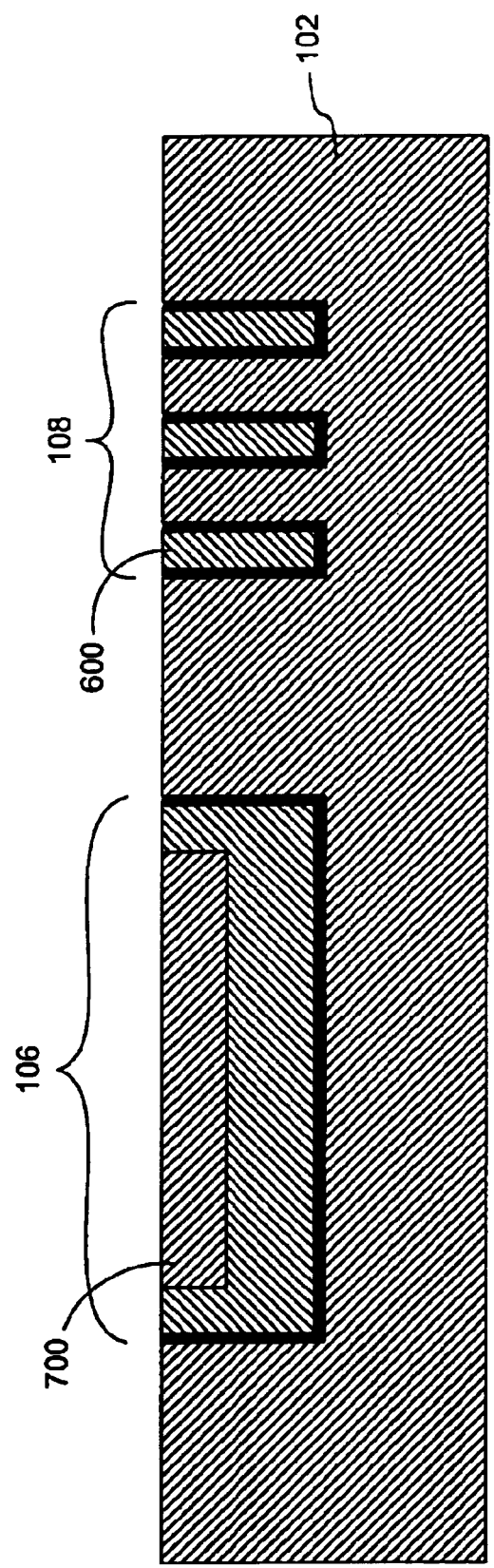
FIG. 8 is a cross-section of the partially fabricated semiconductor device of FIG. 7 after further planarization according to an embodiment of the invention.

FIG. 8 provides a cross-section of the partially fabricated semiconductor device of FIG. 7 after removal of the overburden 602 and a portion of the second conductive layer 700. As can be seen in FIG. 8, removing the conductive materials between the tops of trenches 106, 108 selectively exposes the substrate 102 between the tops of trenches 106, 108 and electrically isolates the conductive materials remaining within the trenches 106, 108. The conductive materials within the wide trench 106 can form an electrical interconnect, for example, in a completed semiconductor device. Similarly, the portions of the first conductive layer 600 remaining in the narrow trenches 108 can form elements of an array.

Figure 2:
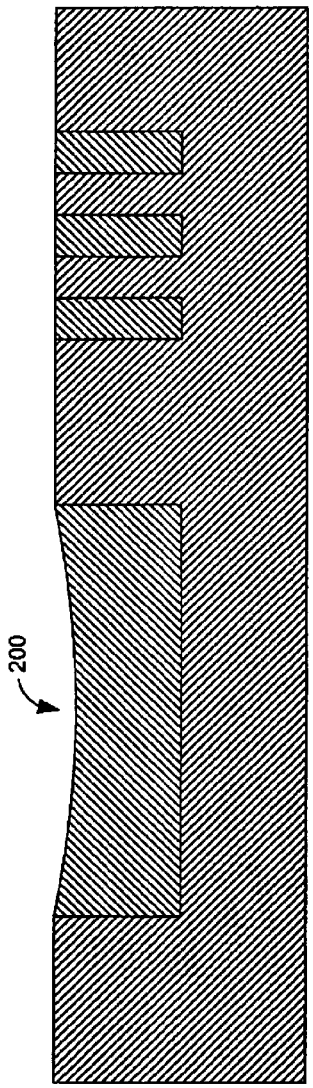
FIG. 2 is a cross-section of the partially fabricated semiconductor device of FIG. 1 after a planarization according to the prior art.

Referring again to FIG. 7, the pre-planarized surface 702 allows various planarization techniques to be successfully employed to create the partially fabricated semiconductor device of FIG. 8 without the dishing 200 illustrated in FIG. 2. Examples of planarization techniques that can be employed in the present invention include Chemical-Mechanical Polishing (CMP), Stress-Free Planarization (SFP), and electrochemical polishing. Many CMP techniques are well known in the art. SFP techniques are especially well suited for use where the substrate 102 includes a weak or brittle material, such as OSG or porous OSG, as these techniques produce little or no shear forces at the planarized surface. Some SFP techniques include plasma etching. Some other SFP techniques employ a conventional rotating polishing pad. Some of these techniques rely on very low applied pressures to reduce shear forces, while others use abrasive-free polishing solutions, and still other techniques combine low applied pressures with abrasive-free polishing solutions. Additionally, electrochemical polishing techniques can be employed, for example, by applying a voltage across the substrate 102 through a conductive pad.

Figure 9:
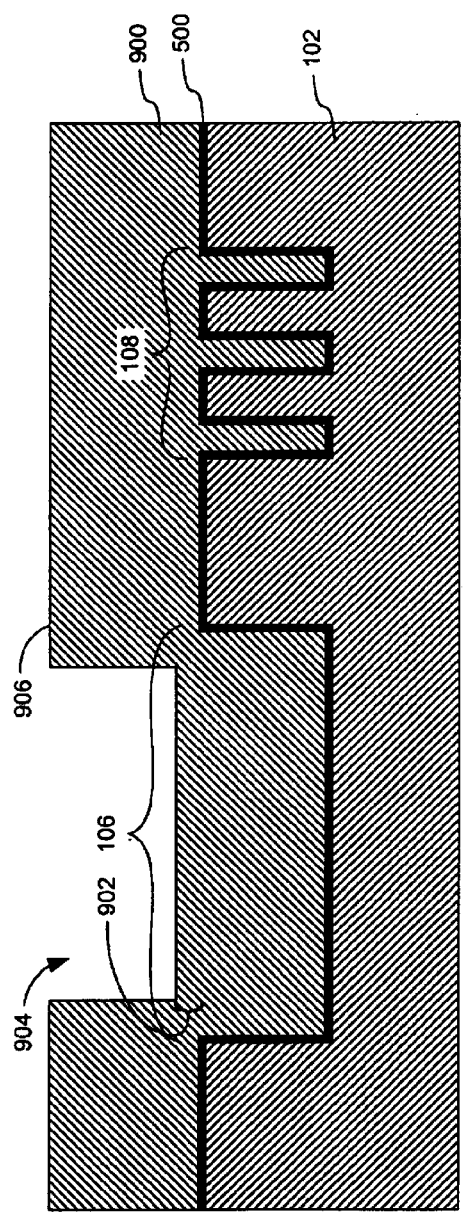
FIG. 9 is a cross-section of the partially fabricated semiconductor device of FIG. 5 after a first conductive layer has been formed over the substrate according to another embodiment of the invention.

In other embodiments, rather than having first conductive layer 600 only partially fill the wide trench 106 as in FIGS. 6A and 6B, the wide trench 106 is instead completely filled. In accordance with these embodiments, FIG. 9 provides a cross-section of the partially fabricated semiconductor device of FIG. 5 after a first conductive layer 900 has been formed over the substrate 102 and over any optional layers 500. First conductive layer 900 is preferably formed of a highly conductive metal such as Cu, and can be formed, for example, by an electrochemical deposition technique such as electroplating.

As shown in FIG. 9, the first conductive layer 900 completely fills the wide trench 106. In some embodiments, the first conductive layer 900 forms an overfill 902 that extends about 10% to about 20% of a depth of the wide trench 106 above the level of the top surface of the substrate 102. It will be appreciated that although first conductive layer 900 completely fills the wide trench 106, a cavity 904 aligned with the wide trench 106 still exists in the first conductive layer 900. It will also be appreciated that in some of these embodiments an overburden 906 is sufficiently thick that a thickness of the overburden 906 is substantially the same over both narrow trenches 108 and over those surfaces between the tops of trenches 106, 108, as shown in FIG. 9.

Figure 10:
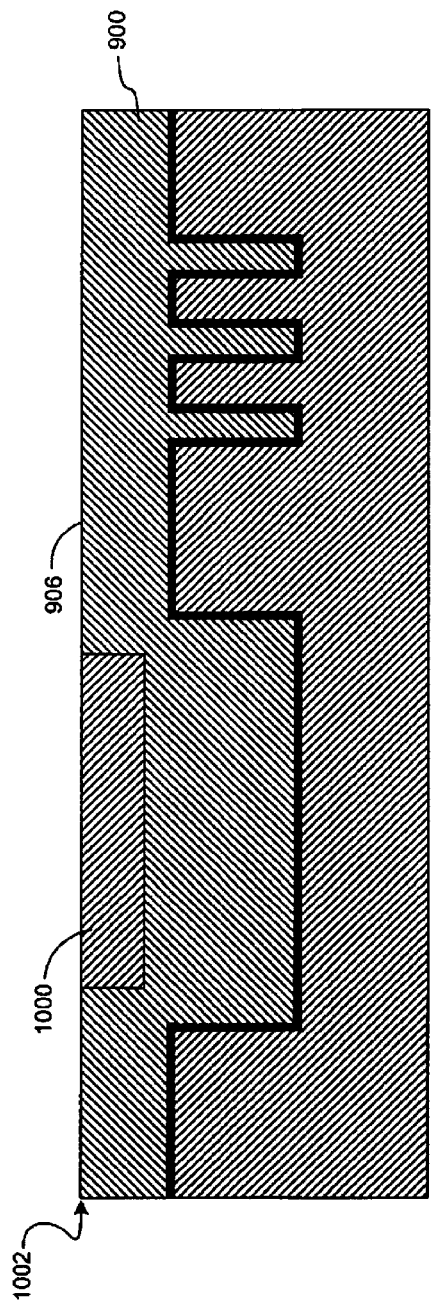
FIG. 10 is a cross-section of the partially fabricated semiconductor device of FIG. 9 after a second conductive layer has been formed according to an embodiment of the invention.

FIG. 10 provides a cross-section of the partially fabricated semiconductor device of FIG. 9 after a second conductive layer 1000 has been formed within the cavity 904 (FIG. 9). Second conductive layer 1000 is also preferably formed of a highly conductive metal such as Cu, and in some embodiments the first and second conductive layers 900, 1000 are formed of the same conductive material. Second conductive layer 1000 can be formed, for example, by an electroless deposition technique such as electroless plating. In some embodiments, as shown in FIG. 10, while the second conductive layer 1000 is being formed within the cavity 904, any remaining superfill and some of the overburden 906 are being removed. In these embodiments, once the second conductive layer 1000 is complete, the second conductive layer 1000 has a top surface that is essentially coplanar with a top surface of the overburden 906. Together, the top surfaces of the overburden 906 and the second conductive layer 1000 form a pre-planarized surface 1002.

Figure 11:
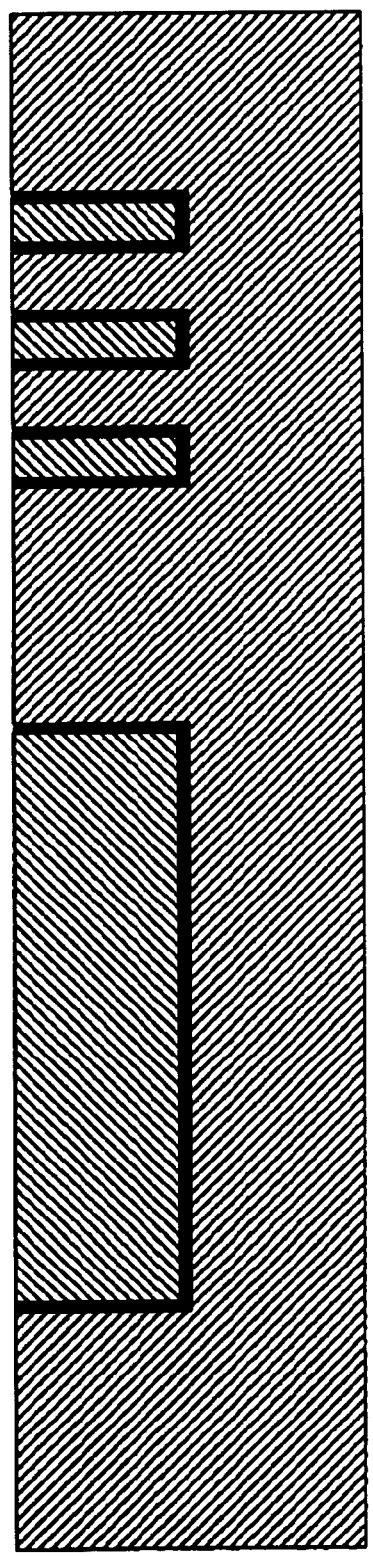
FIG. 11 is a cross-section of the partially fabricated semiconductor device of FIG. 10 after further planarization according to an embodiment of the invention.

FIG. 11 provides a cross-section of the partially fabricated semiconductor device of FIG. 10 after removal of the overburden 906 (FIG. 10) and all of the second conductive layer 1000 (FIG. 10). The pre-planarized surface 1002 in FIG. 10 allows various planarization techniques to be successfully employed to create the partially fabricated semiconductor device of FIG. 11 without the dishing 200 illustrated in FIG. 2. Examples of planarization techniques that can be employed in the present invention are discussed elsewhere herein.

Figure 12:
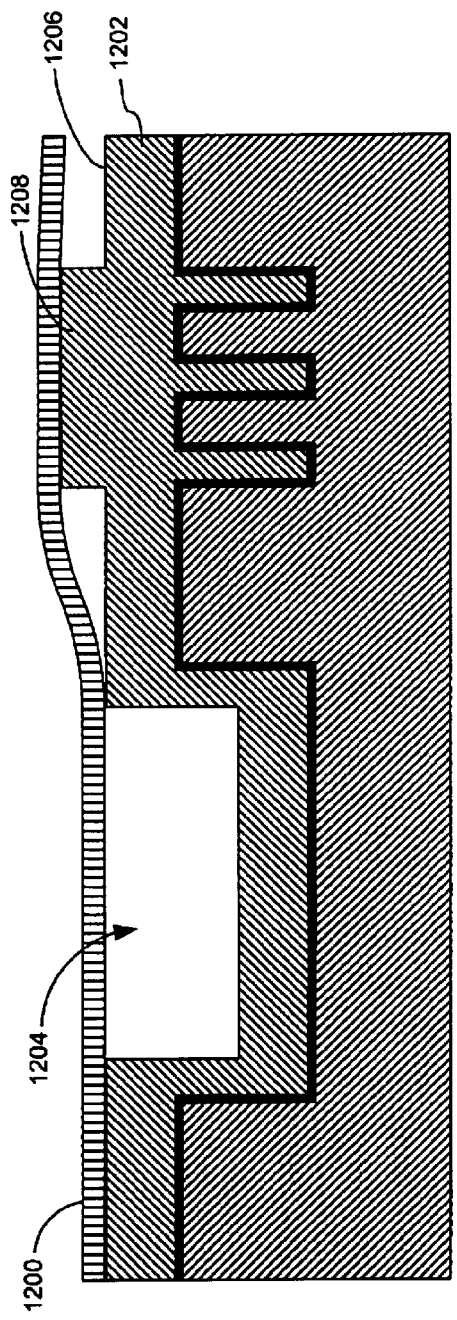
FIG. 12 is a cross-section of a partially fabricated semiconductor device contacting a flexible material according to an embodiment of the invention.
Figure 13:
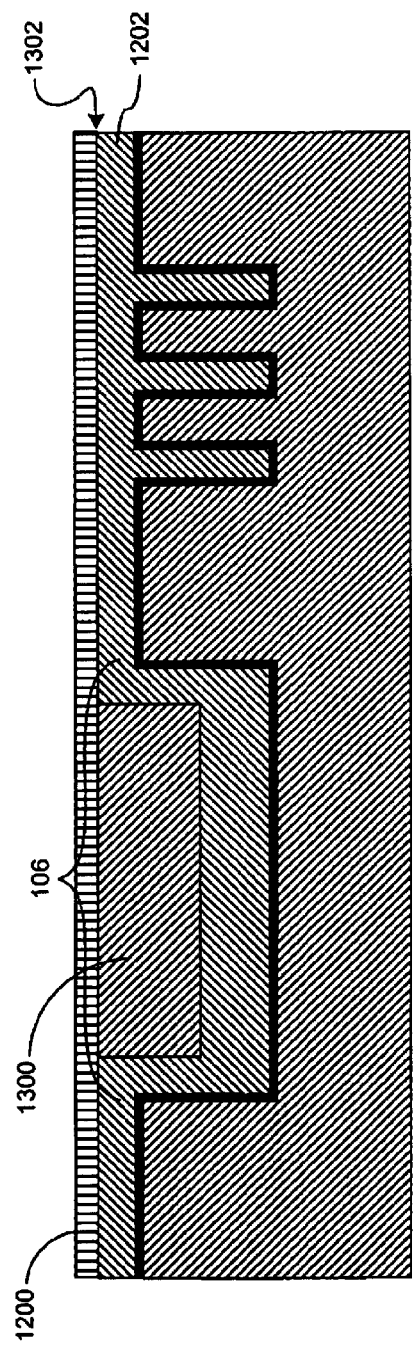
FIG. 13 is a cross-section of the partially fabricated semiconductor device of FIG. 12 after a second conductive layer has been formed according to an embodiment of the invention.

FIGS. 12 and 13 illustrate one method for achieving the pre-planarized surface 702 of FIG. 7. Specifically, FIG. 12 provides a cross-section of a partially fabricated semiconductor device, such as that shown in FIG. 6A, with a flexible material 1200 contacting a first conductive layer 1202. It will be appreciated that the method described with reference to FIGS. 12 and 13 is equally applicable to those embodiments illustrated with respect to FIGS. 9 and 10. Accordingly, first conductive layer 1202 is representative of both first conductive layers 600 and 900.

Flexible material 1200 can serve several functions in the process of forming a pre-planarized surface such as pre-planarized surface 702 (FIG. 7) or pre-planarized surface 1002 (FIG. 10). One function of flexible material 1200 is to support a mass transport of material to a cavity that will be filled by a second conductive layer such as second conductive layer 700 (FIG. 7). Similarly, in those embodiments in which the formation of the second conductive layer within the cavity creates waste products, flexible material 1200 also can function to support the mass transport of the waste products away from the cavities. Another function of flexible material 1200 in some embodiments is to inhibit growth of the second conductive layer in areas other than cavities. Still another function of flexible material 1200 in some embodiments is to selectively reduce the thickness of the first conductive layer 1202 by removing superfill effects and by thinning the overburden.

In some embodiments, such as those described with respect to FIGS. 14–17, flexible material 1200 supports a mass transport of material to a cavity 1204 by providing for the mass transport through its thickness. For instance, flexible material 1200 can be a porous membrane so that a solution, such as an electroless plating solution, can be made to flow therethrough. A pressurized reservoir (not shown) on one side of the flexible material 1200 can cause the solution to flow through the flexible material 1200 and into the cavity 1204. It will be appreciated that any such flexible material 1200 should have a sufficient stiffness over dimensions comparable to the widest dimension of the cavity 1204 (this dimension is commonly referred to as a "planarization length") such that the flexible material 1200 remains essentially flat over the cavity 1204 instead of bowing into the cavity 1204. At the same time, the flexible material 1200 should be compliant enough that it is able to conform to features having peak-to-peak dimensions greater than the planarization length. In some embodiments the flexible material 1200 provides a planarization length of up to 500 microns. It should be noted that FIG. 12 is not to scale inasmuch as the bend in the flexible material 1200 between the cavity 1204 and a superfill 1208 has been exaggerated.

In those embodiments in which flexible material 1200 supports a mass transport of material through its thickness, suitable materials for flexible material 1200 include porous membranes formed of polyurethane, porous or sintered polymeric materials such as polyethylene, polypropylene, and fluorocarbon materials such as Teflon™, and ceramics. In some embodiments the flexible material has a thickness between about 0.1 mm to about 3.0 mm. An appropriate flexible material 1200 for a particular application should be one that is compatible with the intended solution. For instance, the flexible material 1200 should be chemically resistant to the solution. To provide adequate mass transport of the solution through the flexible material 1200, the flexible material 1200 should include a number of channels of sufficient diameter. An open-cell pore structure provides the channels in some flexible materials 1200, while other flexible materials 1200 are perforated with a number of holes disposed through the flexible material 1200 from one side to the other. In still other embodiments holes are added to an otherwise porous flexible material 1200. Such holes can be produced by laser drilling, for example. In some embodiments the amount of porosity, whether inherent or added, is between about 5% to about 50%, while in other embodiments the porosity is between about 10% to about 20%.

Figure 18:
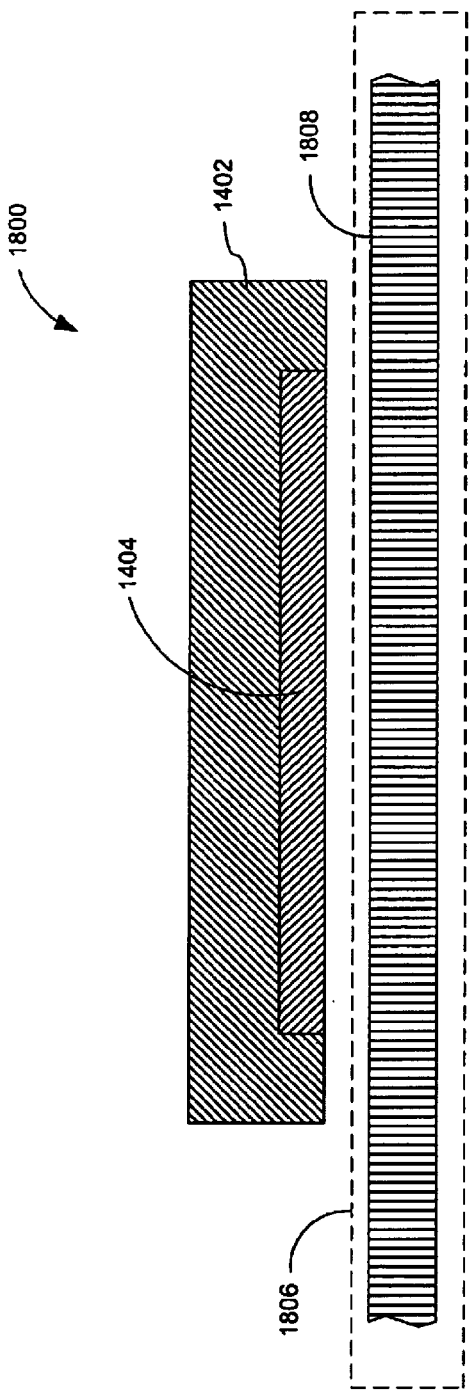
FIG. 18 is a side elevation view of a cross-section of another apparatus for producing a pre-planarized surface according to an embodiment of the invention.
Figure 19:
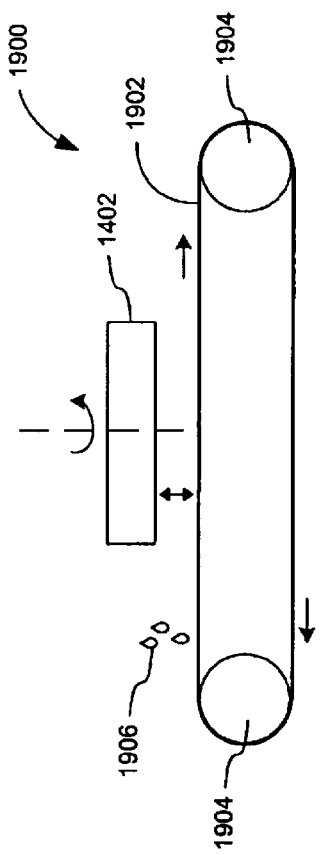
FIG. 19 a side elevation view of another apparatus for producing a pre-planarized surface according to an embodiment of the invention.

In other embodiments, such as those described with respect to FIGS. 18 and 19, flexible material 1200 supports a mass transport of material to a cavity 1204 by carrying a solution, such as an electroless plating solution. For instance, flexible material 1200 can be a poromeric material such as a polymeric material that has a closed-cell structure with open pores exposed at a surface. After the surface is wetted by the solution, relative lateral motion can then be used to deliver the solution to the cavity 1204.

Another function of flexible material 1200 in some embodiments is to inhibit growth of the second conductive layer in areas other than cavities. It will be appreciated that where broad areas of an overburden 1206 or the superfill 1208 are in direct contact with the flexible material 1200 the presence of the flexible material 1200 can inhibit deposition of the second conductive layer directly or through inhibition of mass transport in those regions. Relative lateral motion between the flexible material 1200 and the areas of the overburden 1206 can also inhibit deposition of the second conductive layer.

Still another function of flexible material 1200 in some embodiments is to selectively reduce the thickness of the first conductive layer 1202 by removing superfill effects and by thinning the overburden 1206. In these embodiments a relative lateral motion between the flexible material 1200 and the areas of the overburden 1206 is used to thin the overburden 1206. Thinning can be accelerated through the use of abrasives. In some embodiments, the flexible material 1200 includes an abrasive that is dispersed throughout such that some of the abrasive is exposed at the surface in contact with the overburden 1206. In other embodiments, polishing media such as a polishing pad, cloth, or tape is used as the flexible material 1200. In some of these embodiments holes can be added to the polishing media to create additional porosity to allow a solution to be delivered therethrough.

As noted herein, a relative lateral motion can enhance the method of the invention in many ways. Relative lateral motion can include linear translations along one or two axes, reciprocation, vibration, rotation, orbital motion, and the combinations thereof. Examples of relative lateral motions will be discussed in further detail with respect to the embodiments shown in FIGS. 14–19.

FIG. 13 provides a cross-section of the partially fabricated semiconductor device of FIG. 12 after a second conductive layer 1300 has been formed within the cavity 1204 (FIG. 12). A pre-planarized surface 1302 results from forming the second conductive layer 1300 within the cavity 1204 while contemporaneously thinning the overburden 1206 (FIG. 12) and removing any superfill 1208 of the first conductive layer 1202. The flexible material 1200 can be removed after the pre-planarized surface 1302 has been completed. Thereafter, additional planarization of the first and second conductive layers 1202 and 1300 can be performed to electrically isolate the conductive materials in the wide and narrow features. In those embodiments in which the first conductive layer 1202 does not completely fill the wide trench 106, planarizing the second conductive layer 1300 does not completely remove the second conductive layer 1300 and a structure is produced such as the one shown in FIG. 8. In those embodiments in which the first conductive layer 1202 does completely fill the wide trench 106, planarizing the second conductive layer 1300 removes the entire second conductive layer 1300 and a structure is produced such as the one shown in FIG. 11.

Figure 14:
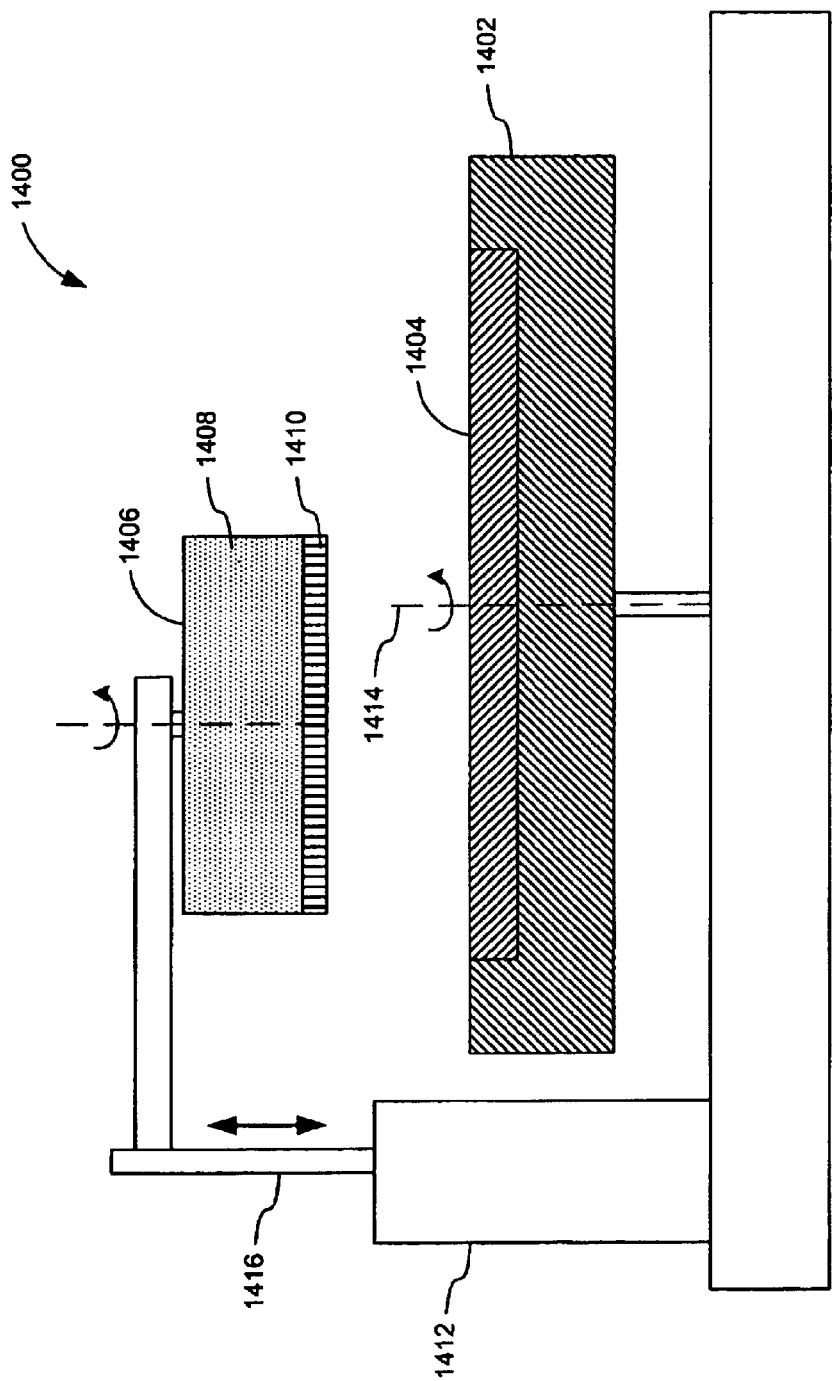
FIG. 14 is a side elevation view of a partial cross-section of an apparatus for producing a pre-planarized surface according to an embodiment of the invention.

FIGS. 14–19 further illustrate various apparatus embodiments of the invention. FIG. 14 shows a side elevation view of a partial cross-section of one embodiment of an apparatus 1400 for producing a pre-planarized surface. The apparatus 1400 includes a wafer support 1402 (in cross-section) for securing a wafer 1404 (in cross-section) during processing. The apparatus 1400 also includes a workpiece 1406 (in cross-section) that in this embodiment includes a reservoir 1408 and a porous membrane 1410. A support structure 1412 supports the workpiece 1406 relative to the wafer 1404.

The wafer support 1402 secures the wafer 1404. In some embodiments the wafer support 1402 is a vacuum chuck. In some embodiments the wafer support 1402 is rotatable around an axis 1414 as shown in FIG. 14, while in other embodiments the wafer support 1402 is non-rotatable. Rotation of the wafer support 1402 is one method for introducing a relative lateral motion between the workpiece 1406 and the wafer 1404.

The support structure 1412 supports the workpiece 1406 relative to the wafer 1404. Accordingly, the support structure 1412 includes an engagement mechanism 1416 to adjust a spacing between the workpiece 1406 and the wafer 1404. The engagement mechanism 1416 lowers the workpiece 1406 until the porous membrane 1410 is in contact with the wafer 1404. In some embodiments, the engagement mechanism 1416 continues to lower the workpiece 1406 until a slight pressure is developed between the workpiece 1406 and the wafer 1404. Once the pre-planarized surface is completed, the engagement mechanism 1416 raises the workpiece 1406 off of the wafer 1404. Alternatively, rather than moving the workpiece 1406, an alternative engagement mechanism (not shown) can be used to raise and lower the wafer support 1402. Various mechanisms suitable for engagement mechanism 1416 are well known in the art and include, for example, a spindle assembly. In some embodiments, the support structure 1412 also includes means for introducing a relative lateral motion between the workpiece 1406 and the wafer 1404 as will be described with respect to FIGS. 15–17. Further variations include placing the workpiece 1406 on the bottom and locating the wafer support 1402 on the top.

As noted, the workpiece 1406 in this embodiment includes a reservoir 1408 and a porous membrane 1410. In some embodiments the porous membrane 1410 is replaced by some other flexible material 1200 (FIG. 12). The porous membrane 1410 spans an open side of the workpiece 1406 that faces the reservoir 1408. Accordingly, the reservoir 1408 can be filled with a solution and then pressurized to force the solution out through the porous membrane 1410. In some embodiments the flow through the porous membrane 1410 is about 5 to about 500 ml/min. In some embodiments the reservoir 1408 is pressurized to about 5 to about 50 psi.

Numerous techniques are well known in the art for pressurizing a reservoir and can be adapted to the present invention. For example, in some embodiments the reservoir 1408 is partially filled with the solution and then a compressed gas (e.g., air, $N_2$, Ar, etc.) is introduced above the level of the solution until the desired pressure is obtained. In other embodiments a syringe pump delivers the solution to the reservoir 1408 at the desired pressure. Similarly, in other embodiments a diaphragm pump having a pressure-regulated flow delivers the solution to the reservoir 1408. In still other embodiments the solution is delivered from a pressurized canister that contains a bladder filled with the solution. As the canister is pressurized with a compressed gas the pressure within the bladder increases, driving the solution out of the bladder and into the reservoir 1408.

Figure 15:
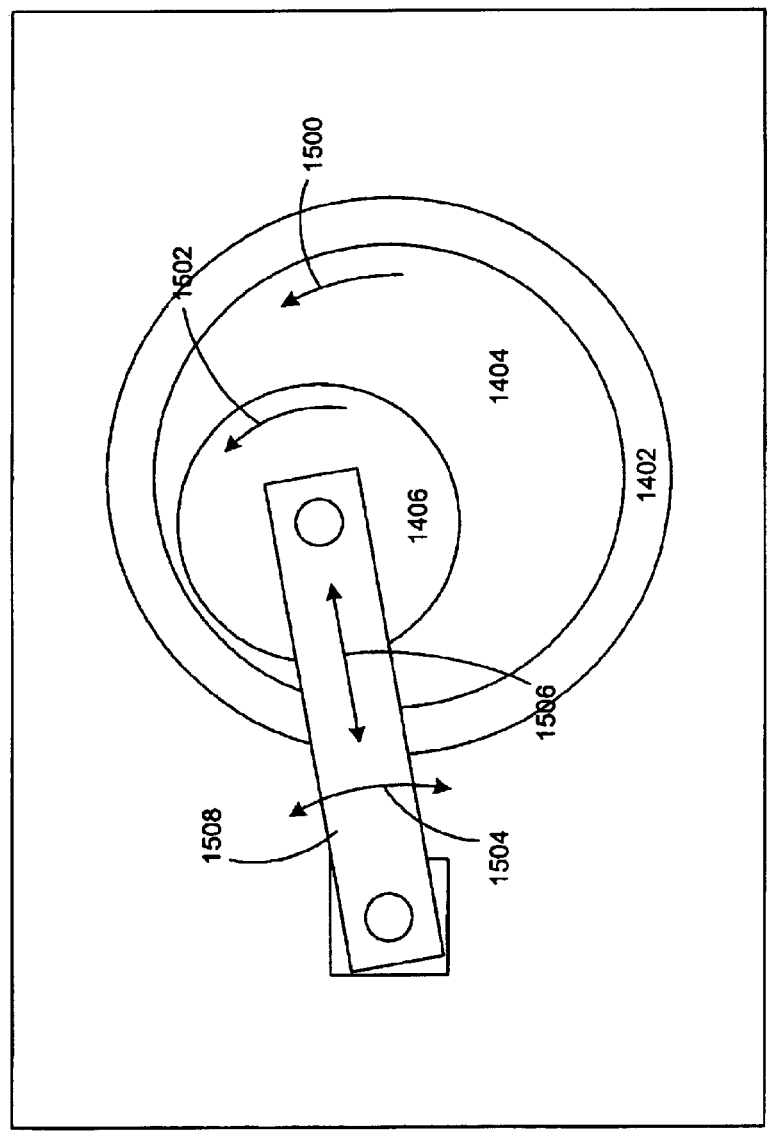
FIG. 15 is a top plan view of the apparatus of FIG. 14 according to an embodiment of the invention.

FIG. 15 shows a top plan view of the apparatus of FIG. 14. As can be seen from the perspective shown in FIG. 15, although the workpiece 1406 covers an area that is smaller than an area of the wafer 1404, relative lateral motion between the workpiece 1406 and the wafer 1404 can assure that the workpiece 1406 makes contact with most or all of the entire area of the wafer 1404 during the formation of a pre-planarized surface. The relative lateral motion can be introduced in many different ways. For example, rotation 1500 of the wafer 1404 around axis 1414 (FIG. 14) can be achieved by mounting the wafer support 1402 on a spindle that is rotated by a drive mechanism.

Additional relative lateral motions can be introduced through the workpiece 1406, for example by rotation 1502 of the workpiece 1406. Further relative lateral motions can be introduced by laterally translating the workpiece 1406. Two types of lateral translational motions are indicated by FIG. 15, reciprocal translation 1504 and linear translation 1506. Linear translation 1506 can be achieved, for example, by extending an arm 1508 that supports the workpiece 1406 as shown, or by linearly translating the wafer 1404 beneath the workpiece 1406. The latter can be achieved, for instance, by placing the wafer support 1402 on a reciprocating assembly having linear bearings. Additional relative lateral motions can be introduced by vibrating either or both of the workpiece 1406 and the wafer 1404. It will be appreciated that various combinations of the several relative lateral motions can also be used including orbital motions.

As noted herein, for embodiments in which the workpiece 1406 has a smaller area than the area of the wafer 1404, the relative lateral motion between the workpiece 1406 and the wafer 1404 can assure that the method of forming a pre-planarized surface is applied to the entire area of the wafer 1404. It should also be noted that in these and other embodiments relative lateral motions can also improve the flow rate of the solution through the porous membrane 1410 (FIG. 14) and improve mass transport within cavities as the second conductive layer is deposited. Specifically, relative lateral motion, such as vibration, can improve circulation within cavities to help move fresh solution to, and move depleted solution and waste products away from, a growing layer of the second conductive material.

Figure 16:
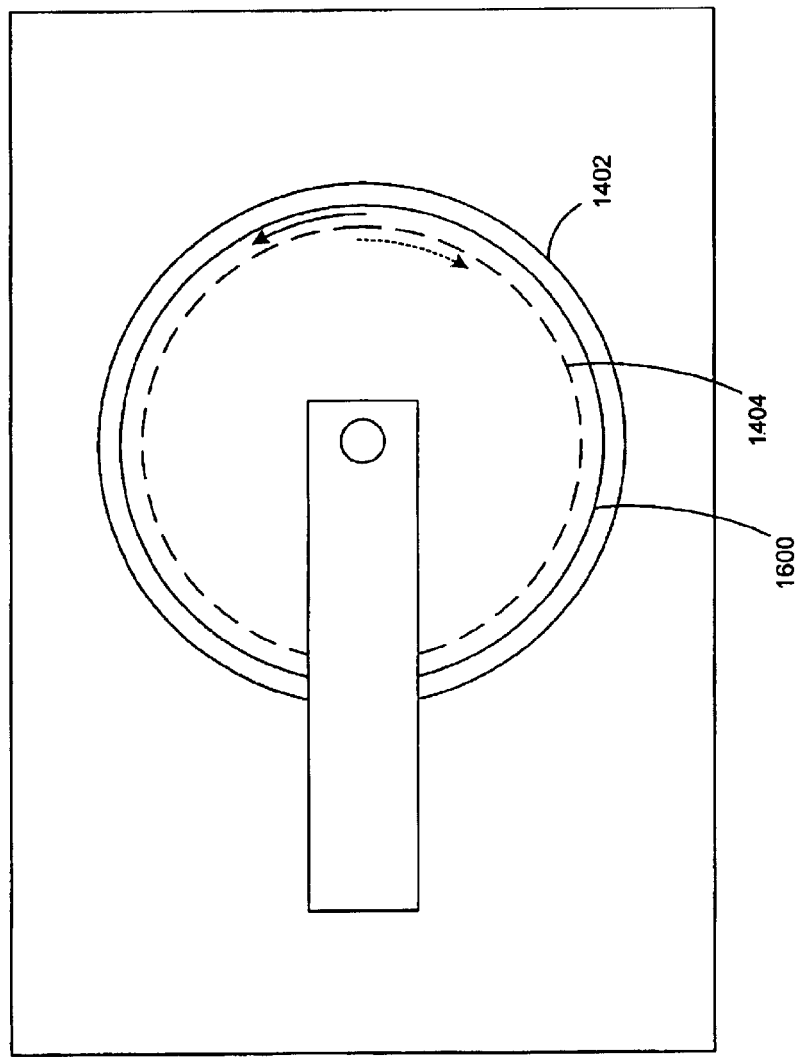
FIG. 16 is a top plan view of another apparatus for producing a pre-planarized surface according to an embodiment of the invention.

FIG. 16 shows a top plan view of an apparatus according to another embodiment of the present invention. The embodiment illustrated in FIG. 16 is similar to that described with respect to FIG. 15, however in the embodiment of FIG. 16 the workpiece 1600 has a larger area than that of the wafer 1404 and therefore the workpiece 1600 can contact the entire wafer area at any given time. Relative lateral motion can be introduced between the workpiece 1600 and the wafer 1404 by rotating either or both of the workpiece 1600 and wafer 1404. Other relative lateral motions noted with respect to FIG. 15 such as vibration can also be employed. It will be appreciated that since the area of the workpiece 1600 is greater than the area of the wafer 1404, the workpiece 1600 can take a shape other than the circular shape shown in FIG. 16.

Figure 17:
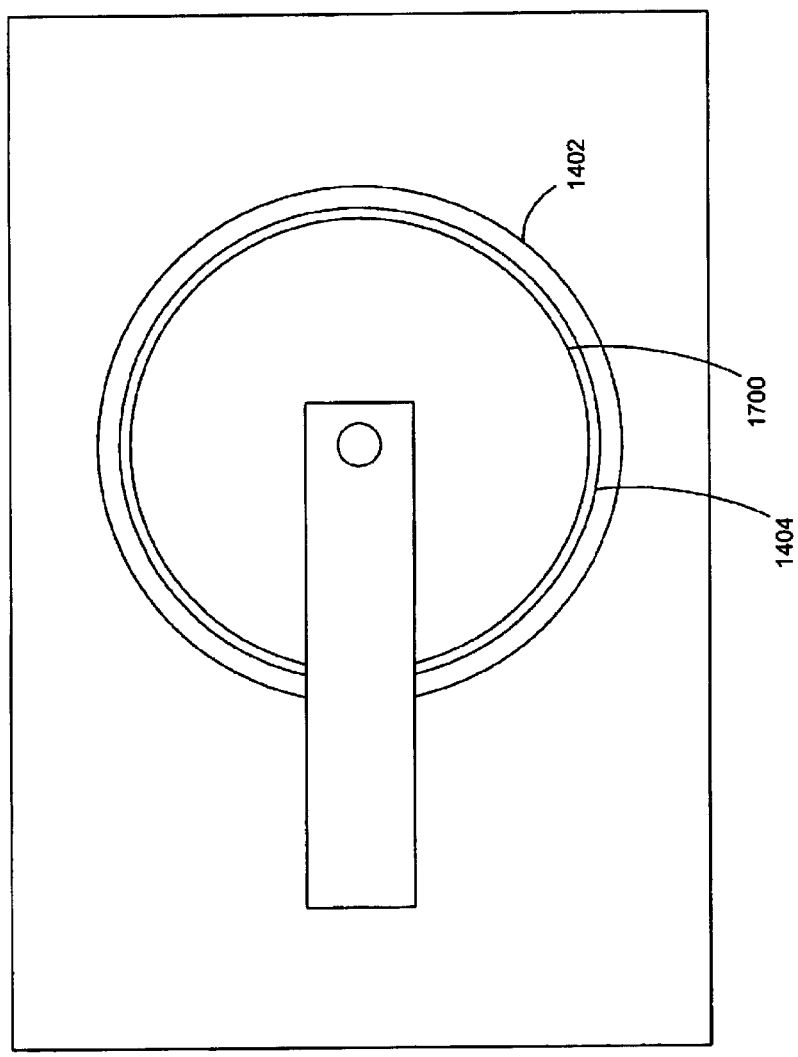
FIG. 17 is a top plan view of another apparatus for producing a pre-planarized surface according to an embodiment of the invention.

FIG. 17 shows a top plan view of an apparatus according to still another embodiment of the present invention. The embodiment illustrated in FIG. 17 is similar to that described with respect to FIGS. 15 and 16, however in the embodiment of FIG. 17 the workpiece 1700 has an area equal to, or slightly smaller than, that of the wafer 1404. Where the area of the workpiece 1700 is smaller than that of the wafer 1404, a small relative lateral motion such as by vibration or orbital oscillation can assure that the workpiece 1700 forms a pre-planarized surface across the entire area of the wafer 1404. Other forms of relative lateral motion described elsewhere herein can also be employed.

FIG. 18 shows a cross-section of another embodiment of an apparatus 1800 for producing a pre-planarized surface. The apparatus 1800 includes a wafer support 1402 for securing a wafer 1404 during processing. The apparatus 1800 also includes a workpiece 1806 that in this embodiment includes a poromeric material 1808. A support structure (not shown) holds the wafer support 1402 relative to the workpiece 1806 and allows the workpiece 1806 to be brought into contact with the wafer 1404, much as the support structure 1412 (FIG. 14) supports the workpiece 1406 relative to the wafer support 1402. Although the workpiece 1806 is shown as being below the wafer 1404 in FIG. 18, it will be understood that the workpiece 1806 can alternately be positioned above the wafer 1404.

FIG. 19 shows a side elevation view of an apparatus 1900 that is one possible variation of apparatus 1800 (FIG. 18). In apparatus 1900, the flexible material is provided as a continuous loop 1902 around a pair of rollers 1904. A support structure (not shown) allows the wafer 1404 (FIG. 18) to be brought into contact with the continuous loop 1902, or vice-versa. A linear relative lateral motion is achieved in this embodiment by driving the continuous loop 1902 around the pair of rollers 1904. Additional relative lateral motion can be achieved by rotating the wafer support 1402, as shown. Further relative lateral motions can be introduced by applying other motions to the wafer support 1402, such as vibration and orbital motion, as described elsewhere herein. Although the poromeric material is provided as a continuous loop 1902 in this embodiment, it will be appreciated that in other embodiments the poromeric material can take other forms, such as a disk or a rectangle. In some embodiments the poromeric material includes raised edges to contain the electroless solution.

In the embodiments shown in FIGS. 18 and 19, a surface of the poromeric material is wetted by a solution 1906. The solution 1906 is then carried by the poromeric material to the wafer 1404 (FIG. 18). Although FIG. 19 shows solution 1906 being dripped or sprayed onto the continuous loop 1902, other methods for delivering the solution 1906 to the surface of a poromeric material can also be used. For example, one roller 1904 can be immersed in a reservoir of the solution.

In the foregoing specification, the invention is described with reference to specific embodiments thereof, but those skilled in the art will recognize that the invention is not limited thereto. Various features and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive.

What is claimed is:

1. A method for producing a planarized surface, comprising:
providing a substrate having a narrow feature and a wide feature defined therein;
forming a first layer above the substrate, the first layer filling the narrow feature, at least partially filling the wide feature, and having a cavity defined therein and aligned with the wide feature;
forming a second layer in the cavity while contemporaneously planarizing the first layer, wherein forming the second layer includes contacting a flexible material with the first layer, and introducing a relative lateral motion between the flexible material and the first layer, wherein the relative lateral motion includes a vibrational component; and
planarizing the first and second layers together.

2. The method of claim 1 wherein the relative lateral motion further includes a rotational component.

3. The method of claim 1 wherein the relative lateral motion further includes an orbital component.

4. The method of claim 1 wherein planarizing the first and second layers does not completely remove the second layer.

5. The method of claim 1 wherein planarizing the first and second layers includes a stress-free planarization.

6. The method of claim 1 wherein planarizing the first and second layers includes a chemical-mechanical planarization.

7. The method of claim 1 wherein planarizing the first and second layers includes exposing the substrate between the narrow and wide features.

8. The method of claim 1 wherein the flexible material includes a porous membrane.

9. The method of claim 8 further comprising pressurizing a reservoir containing the solution and adjoining the membrane on a side opposite a side contacting the first layer.

10. The method of claim 8 wherein the porous membrane includes polyurethane.

11. The method of claim 8 further comprising introducing a relative lateral motion between the porous membrane and the substrate.

12. The method of claim 11 wherein the porous membrane is effective to polish the portion of the first layer.

13. The method of claim 11 wherein the porous membrane includes an abrasive.

14. The method of claim 1 wherein the flexible material includes a poromeric material.

15. The method of claim 14 wherein the poromeric material includes a closed-cell structure with open pores exposed at a surface thereof.

16. The method of claim 14 further comprising wetting the poromeric material with the solution.

17. The method of claim 14 wherein delivering the solution to the cavity includes developing a pressure between the poromeric material and the first layer.

18. The method of claim 14 wherein delivering the solution to the cavity includes introducing a relative lateral motion between the substrate and the poromeric material.

19. A method for producing a planarized surface, comprising:
providing a substrate having a narrow feature and a wide feature defined therein;
forming a first layer above the substrate, the first layer filling the narrow feature, at least partially filling the wide feature, and having a cavity defined therein and aligned with the wide feature;
forming a second layer in the cavity while contemporaneously planarizing the first layer; and planarizing the first and second layers together;
wherein the first layer completely fills the wide feature and planarizing the first and second layers includes completely removing the second layer.

20. The method of claim 19 wherein the substrate includes a dielectric material with a dielectric constant less than a dielectric constant of $SiO_2$.

21. The method of claim 20 wherein the dielectric material includes OSG.

22. The method of claim 19 wherein the narrow feature has a lateral dimension of about 100 nm or less.

23. The method of claim 19 wherein the wide feature has a lateral dimension greater than about 100 nm.

24. The method of claim 23 wherein the wide feature has a lateral dimension of about 500 $\mu$m.

25. The method of claim 19 wherein forming the first layer includes forming a first conductive layer.

26. The method of claim 25 wherein forming the first conductive layer includes an electrochemical deposition of a conductive material.

27. The method of claim 26 wherein the conductive material is copper.

28. A method for producing a planarized surface, comprising:
    providing a substrate including a narrow feature and a wide feature;
    forming a first layer above the substrate, the first layer filling the narrow feature, at least partially filling the wide feature, and including a cavity aligned with the wide feature;
    contacting a flexible material with at least a portion of the first layer;
    using the flexible material to deliver a solution including an electroless plating solution to the cavity;
    forming a second layer in the cavity from the solution; and planarizing the first and second layers.

29. The method of claim 28 wherein forming the second layer includes forming a second conductive layer.

30. The method of claim 28 wherein the first and second layers are formed of the same conductive material.

31. The method of claim 28 wherein contacting the flexible material with at least the portion of the first layer inhibits the deposition of the second layer above an overburden of the first layer.

32. A method for producing a planarized surface, comprising:
    providing a substrate including a narrow feature and a wide feature;
    forming a first layer above the substrate, the first layer filling the narrow feature, at least partially filling the wide feature, and including a cavity aligned with the wide feature;
    contacting a flexible material with at least a portion of the first layer;
    using the flexible material to deliver a solution to the cavity;
    forming a second layer in the cavity from the solution; and planarizing the first and second layers;
    wherein forming the second layer includes forming a second conductive layer, and forming the second conductive layer includes an electroless deposition of a conductive material.

33. The method of claim 32 wherein thee conductive material is copper.

34. The method of claim 32 wherein planarizing the first and second layers includes applying a stress-free polishing technique.

35. The method of claim 32 wherein forming the first layer includes filling less than the entire wide feature.

36. The method of claim 35 wherein about 10% to about 30% of a depth of the wide feature is filled by the first layer.

37. The method of claim 35 wherein planarizing the first and second layers includes removing less than the entire second layer.

38. A method for producing a planarized surface, comprising:
    providing a substrate including a narrow feature and a wide feature;
    forming a first layer above the substrate, the first layer filling the narrow feature, at least partially filling the wide feature, and including a cavity aligned with the wide feature;
    contacting a flexible material with at least a portion of the first layer;
    using the flexible material to deliver a solution to the cavity;
    forming a second layer in the cavity from the solution; and planarizing the first and second layers;
    wherein forming the first layer includes completely filling the wide feature.

39. The method of claim 38 wherein the first layer forms an overfill above the wide feature that extends about 10% to about 20% of a depth of the wide feature above a level of a top surface of the substrate.

40. The method of claim 38 wherein planarizing the first and second layers includes removing the second layer.

41. An apparatus for producing a planarized surface, comprising:
    a wafer support for securing a wafer having an area;
    a workpiece including
        a reservoir containing an electroless plating solution and having a flexible and porous membrane spanning a side, the porous membrane having an area less than the area of the wafer;
    an engagement mechanism capable of bringing the workpiece and the wafer into contact with each other; and
    means for introducing a relative lateral motion between the workpiece and the wafer wherein the means for introducing relative lateral motion includes means for vibrating the workpiece.

42. The apparatus of claim 41 wherein the reservoir is pressurizable.

43. The apparatus of claim 41 wherein the means for introducing relative lateral motion includes means for linearly translating the workpiece.

44. The apparatus of claim 41 wherein the means for introducing relative lateral motion further includes means for rotating the workpiece around an axis.

45. The apparatus of claim 41 wherein the means for introducing relative lateral motion includes means for rotating the wafer support around an axis.

46. The apparatus of claim 41 wherein the wafer support is a vacuum chuck.

47. The apparatus of claim 41 wherein the porous membrane includes polyurethane.

48. The apparatus of claim 41 wherein the porous membrane includes a fluorocarbon material.

49. The apparatus of claim 41 wherein the porous membrane has a thickness between about 0.1 mm to about 3.0 mm.

50. The apparatus of claim 41 wherein the porous membrane includes open-cell pore structure.

51. The apparatus of claim 41 wherein the porous membrane includes a number of holes disposed therethrough.

52. The apparatus of claim 41 wherein the porous membrane includes an abrasive.

53. An apparatus for producing a planarized surface, comprising:
- a wafer support for securing a wafer having an area;
- a workpiece including
    - a reservoir containing an electroless plating solution and having a flexible and porous membrane spanning a side, wherein the porous membrane includes a sintered polymeric material;
- an engagement mechanism capable of bringing the workpiece and the wafer into contact with each other; and
- means for introducing a relative lateral motion between the workpiece and the wafer.

54. An apparatus for producing a planarized surface, comprising:
- a wafer support for securing a wafer having an area;
- a workpiece including
    - a reservoir containing an electroless plating solution and having a flexible and porous membrane spanning a side, wherein the porous membrane includes a ceramic;
- an engagement mechanism capable of bringing the workpiece and the wafer into contact with each other; and
- means for introducing a relative lateral motion between the workpiece and the wafer.

55. An apparatus for producing a planarized surface, comprising:
- a wafer support for securing a wafer having an area;
- a workpiece including
    - a reservoir containing an electroless plating solution and having a flexible and porous membrane spanning a side, wherein the porous membrane includes an amount of porosity between about 5% to about 50%;
- an engagement mechanism capable of bringing the workpiece and the wafer into contact with each other; and
- means for introducing a relative lateral motion between the workpiece and the wafer.

56. An apparatus for producing a planarized surface, comprising:
- a wafer support for securing a wafer having an area;
    - a reservoir containing an electroless plating solution and having a flexible and porous membrane spanning a side, wherein the porous membrane includes an amount of porosity between about 10% to about 20%;
- an engagement mechanism capable of bringing the workpiece and the wafer into contact with each other; and
- means for introducing a relative lateral motion between the workpiece and the wafer.

57. An apparatus for producing a planarized surface, comprising:
- a wafer support for securing a wafer;
- a flexible poromeric material, in a shape of a continuous loop, wetted with an electroless plating solution;
- an engagement mechanism capable of bringing the poromeric material into contact with the wafer; and
- means for introducing a relative lateral motion between the poromeric material and the wafer wherein the relative lateral motion includes vibration.

58. The apparatus of claim 57 wherein the poromeric material includes a polymeric material.

59. The apparatus of claim 57 wherein the poromeric material includes a closed-cell structure with open pores exposed at a surface.

60. The apparatus of claim 57 wherein the poromeric material includes a raised edge to contain the electroless plating solution.

61. The apparatus of claim 57 wherein the means for introducing the relative lateral motion includes driving the poromeric material around a pair of rollers.

62. The apparatus of claim 57 wherein the relative lateral motion includes orbital motion.

63. The apparatus of claim 57 wherein the relative lateral motion includes reciprocating motion.

* * * * *